United States Patent
Bajwa et al.

(10) Patent No.: US 9,899,797 B2
(45) Date of Patent: Feb. 20, 2018

(54) LASER DIODE DRIVING SYSTEMS AND METHODS

(71) Applicant: Litrinium, Inc., Aliso Viejo, CA (US)

(72) Inventors: Najabat Hasnain Bajwa, Ladera Ranch, CA (US); Mikhail Barashenka, Lake Forest, CA (US); Hanqing Qian, Irvine, CA (US)

(73) Assignee: LITRINIUM, INC., Aliso Viejo, CA (US)

( * ) Notice: Subject to any disclaimer, the term of this patent is extended or adjusted under 35 U.S.C. 154(b) by 0 days.

(21) Appl. No.: 15/461,431

(22) Filed: Mar. 16, 2017

(65) Prior Publication Data

US 2017/0271844 A1    Sep. 21, 2017

Related U.S. Application Data

(60) Provisional application No. 62/309,243, filed on Mar. 16, 2016, provisional application No. 62/309,270, filed on Mar. 16, 2016.

(51) Int. Cl.
| | |
|---|---|
| *H01S 5/04* | (2006.01) |
| *H01S 5/042* | (2006.01) |
| *H01S 5/06* | (2006.01) |
| *H01S 5/068* | (2006.01) |

(52) U.S. Cl.
CPC .......... *H01S 5/0427* (2013.01); *H01S 5/0617* (2013.01); *H01S 5/06808* (2013.01)

(58) Field of Classification Search
CPC .. H01S 5/0427; H01S 5/0617; H01S 5/06808; H01S 5/026; H01S 5/0261; H01S 3/0912; H01S 3/09702
See application file for complete search history.

(56) References Cited

U.S. PATENT DOCUMENTS

2008/0084904 A1* 4/2008 Hayashi .............. H01S 5/06832
                                                    372/38.02
2012/0263202 A1* 10/2012 Steinle ............... H05B 33/0851
                                                    372/38.02

\* cited by examiner

*Primary Examiner* — Armando Rodriguez
(74) *Attorney, Agent, or Firm* — Fish IP Law, LLC

(57) ABSTRACT

A laser diode driving method that reliably maintains average optical power and extinction ratio is disclosed. The present invention for laser driving uses a preloaded laser diode characteristic curve/table and/or mathematical equations to create a programmable bias and modulation current range. This ensures stable closed-loop operation and prevents system failure if the feedback signal is impaired by confining the operation of the laser diode to a normal operating range.

18 Claims, 2 Drawing Sheets

US 9,899,797 B2

LASER DIODE DRIVING SYSTEMS AND METHODS

This application claims priority to U.S. provisional application Ser. Nos. 62/309,243 and 62/309,270, both filed on Mar. 16, 2016. Those applications, and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The field of the invention is laser diode driving systems.

BACKGROUND

The following description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

When driving lasers, control circuits frequently need to adjust the input in order to compensate for changes in the environment. U.S. Pat. No. 6,031,660 to Park teaches a pump laser diode that detects an optical excitation signal from a pump laser diode and outputs an electrical signal to a controller for the pump laser diode. The current controller compares the current level of the electrical signal received from the photodiode with a level preset by a user, and adjusts the intensity of the electrical signal on the basis of the comparison result. Presetting the bias in accordance with a user input, however, requires a great deal of experimentation time and effort for each laser diode, which can hamper production efficiency.

U.S. Pat. No. 9,083,468 to Zheng teaches a system that accesses a look up table that stores calibration data for drive currents and associated optical wavelengths generated by a laser diode. Zheng's system could apply drive currents or equivalent temperature control voltages associated with an optical wavelength to achieve the idealized wavelength. Zheng's system, however, requires a time-consuming and expensive process to derive calibrated drive currents for each optical wavelength.

U.S. Pat. No. 9,083,467 to Ide teaches a controller that switches an optical mode of a transmitter in response to a measured temperature. Ide's controller measures the temperature of a module and switches the mode when the temperature passes a threshold level. However, if there is a malfunction in the laser diode itself, Ide's controller might switch the mode in a manner to try to correct for an error that is uncorrectable by merely switching the optical mode of the transmitter, which may damages the laser.

Thus, there is still a need for systems and methods for inexpensively driving a laser diode that prevents system failure If a feedback signal is impaired.

SUMMARY OF THE INVENTION

The inventive subject matter provides apparatus, systems and methods in which a closed-loop laser diode driving system generates an output current without damaging the laser diode and/or causing system failure.

The laser diode driving system has a closed-loop feedback system that adjusts the output current of the laser diode driver as a function of the output of the laser diode. The system analyzes the output of the laser diode, typically using a photo detector disposed to receive the output from the laser diode, and generate data representative of the laser. This data is typically amplified using a trans-impedance amplifier, or some other amplifier, which is fed into a feedback bias and modulation comparator that receives this data and generates a recommendation to alter the output current to the laser diode as a function of the data. Generally, the feedback bias and modulation comparator provides the recommendation to maintain a desired extinction ratio between $P_1$ and $P_0$, often measured in dB. The desired extinction ratio between between $P_1$ and $P_0$ generally varies from application to application—for example a GPON application may require a >10 dB extinction ratio target.

Typically, the system compares the data against a target, which will influence the decision to increase/decrease/maintain the bias current to the laser diode, and/or to increase/decrease/maintain the modulation current of the output of the laser diode driver to the laser diode. In some embodiments, the system could have a low target, an average target, and a high target, which could be selected using a user interface, such as an electronic interface or a physical switch. In some embodiments, the low target, average target, and high target could be user-defined. In other embodiments, only the average target is user defined, while the low target and high target are automatically generated by the system as a function of the average target. For example, a pre-loaded, user-defined (via a user interface) look-up table could be utilized that defines high and low targets. Such a look-up table could also comprise temperature-specific settings for driving the laser diode In other embodiments, user-defined customizable mathematical equations could be used to define the high and low targets, for example by defining a ratio or difference between the high and low targets, or by basing the high and low targets upon a temperature of the system.

The laser diode driving system has a bias current table that saves a bounded safety range for a bias of the output current that drives the laser diode, and a modulation current table that saves a bounded safety range for a modulation of the output current that drives the laser diode. The bias current table and the modulation current table could be defined by a preload laser diode driver which saves the bounded safety ranges to a non-transient computer-readable medium. In other embodiments, the bias and modulation settings, including the upper/lower boundary ranges, could be set using customizable mathematical equations that take some input, for example a low target that will be input to a mathematical ratio to define the high target, or an average target that will be input into a mathematical equation to define the low target and the high target.

The laser diode driving system also preferably has a look-up table for temperature characteristics of the laser diode or customizable mathematical equations. Generally, a user defines programmable range settings for each temperature characteristic of the look-up table, which is saved in a non-transient computer-readable medium, and the control mechanism limits the application of the recommendation as a function of the programmable range settings. For example, where the recommendation is to increase bias power, and the temperature of the laser diode indicates that bias power should be increased at a slower rate than normal, the control mechanism will increase the bias power at a slower rate.

Traditional laser diode driving methods are not suitable for high volume production due to extensive time-consuming bias and modulation current look-up table programming over temperature and/or unstable closed loop control systems which can cause laser diode or link failure resulting from abnormal laser bias and modulation current settings. By using the present invention, production efficiency can be maintained through a closed-loop control system with an added preset bias and modulation current range which prevents damage to the laser and ensures link stability.

By creating a bounded range for the bias and modulation currents and combining it with traditional dual closed loop methodologies, we prevent damage to and/or accelerated aging of the laser diode and/or system failure.

Conventional laser driving methods like dual open-loop and single closed-loop add excessive time and cost to build precise look-up tables and are not suitable for low-cost, high volume applications. Current dual closed-loop systems help improve production efficiency but can fail when there is an impaired feedback signal, resulting in undesired operation and/or damage.

The disclosed laser diode driving system uses a preloaded laser diode characteristic curve/table to create a programmable bias and modulation current range. This ensures stable closed-loop operation and prevents system failure if the feedback signal is impaired by confining the operation of the laser diode to a normal operating range. Such systems can be implemented in an integrated circuit and can improve the reliability of any optical communication system that uses laser diodes.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
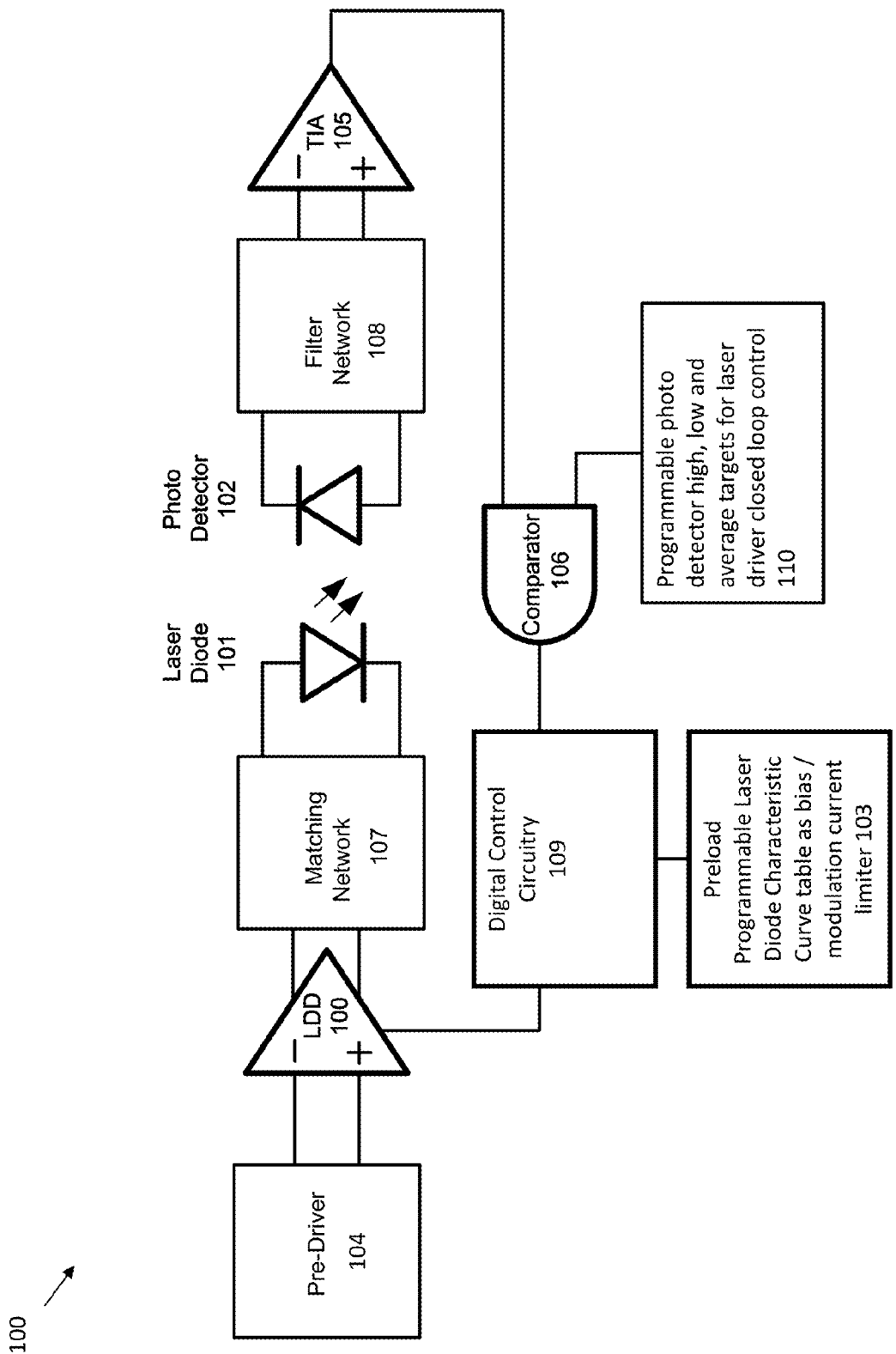
FIG. 1 shows a schematic of an exemplary laser diode driver system.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

Unless the context dictates the contrary, all ranges set forth herein should be interpreted as being inclusive of their endpoints, and open-ended ranges should be interpreted to include commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer or a computer system should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

One should appreciate that the disclosed techniques provide many advantageous technical effects including the ability to rapidly and cheaply build driver device systems that autocorrect with inherent failsafe systems.

Prior art closed-loop systems could, for example, detect that the output laser beam of a laser diode is too weak, and could attempt to increase the input bias of the current powering the laser diode. However, if the laser diode is malfunctioning in some manner, increasing the input bias past a threshold level could only damage the laser diode and fail to correct the output of the laser diode. The inventive subject matter provides apparatus, systems, and methods in which a closed-loop laser diode driving system generates an output current without damaging the laser diode. This method for laser diode driving maintains average optical power for a desired extinction ratio and ensures reliable laser diode operation over temperature in practical applications.

FIG. 1 shows an exemplary laser diode driver system having a laser diode driver 100 that generates bias and modulation currents that drives laser diode 101 via matching network 107. As used herein, a "matching network" matches the impedance of the laser diode driver output with the input impedance of the laser diode. The matching network preferably prevents any signal reflections, noise, or other aberrations that could degrade the signal integrity.

Pre-driver 104 buffers the input of the laser diode driver from the internal laser driver circuitry, which typically has a high load. This provides the necessary isolation and prevents signal degradation and/or damage to the laser diode driver input. Digital Control Circuitry 109 pre-loads current for laser diode driver 100, ensuring that laser diode driver 100 can output a high modulated current without much load time. It also provides loop control and stability, preventing undesired bias and modulation current settings.

Look-up table 103 is used by the system to define a programmable bias and modulation current range. This ensures stable closed-loop operation and prevents system failure if the feedback signal is impaired by confining the operation of the laser diode to a normal operating range. As used herein, a range could be defined as a maximum, a minimum, and preferably as both a maximum and a minimum. When a setting for the output current exceeds a maximum threshold, or falls below a minimum threshold, laser diode driver 100 preferably shuts down or maintains its previous level within the current range. In either situation, the system triggers an error, typically thrown by look-up table 103 or programmable control circuit 10p. The error could be in any suitable form, for example an electronic setting, a data interrupt, a blinking diode or a transmitted message to a tech support entity, such as an email or an SMS message.

Initially, the setting for the bias and modulation of the current produced by laser diode driver 100 is provided by Digital Control Circuitry 109. Comparator 106 will then alter the setting by sending commands to nudging or otherwise alter the bias and/or the modulation output current as part of the feedback mechanism.

The output current is sent to the laser diode 101 via the matching network 107, which provides an output optical signal that is monitored by photo detector 102. Photo detector 102 provides data on the output of laser diode 101 in the form of an electrical signal, which is fed to feedback bias and modulation comparator 106 via an amplifier, for example a trans-impedance amplifier, 105. This feedback signal is compared with target settings 110 to determine if the output signal provided by laser diode driver 100 needs to be altered. The output of photo detector 102 is typically small, and needs to be amplified before being transmitted to comparator 106. Here, the output of photo detector 102 is filtered by a filter matching network 108 which provides the signal to the trans-impedance amplifier 105, which amplifies the data signal and feeds it to a comparator 106, but any other suitable amplifying means could be used without departing from the scope of the invention. In some embodiments, photo detector 102 could provide a strong enough signal such that comparator 106 could analyze the data signal without necessitating an amplifier.

Comparator 106 compares the data received from photo detector 102 (via amplifier 105) against the selected target 110. The modulation and bias current settings are selected using programmable control circuit 109, which derives set targets for laser diode 101 which could be selected through any user interface, for example a switch or digital interface. In some embodiments, programmable control circuit 109 only has a single target. In preferred embodiments, programmable control circuit 109 has more than one target from which a user can choose from.

In such embodiments, a user could program each of the targets for programmable control circuit 109—for example a high target, a low target, and an average target. In other embodiments, the user could define a look-up table with temperature-specific settings for driving laser diode 101. The user could select an ideal operational temperature, which would then automatically select targets associated with that temperature. In preferred embodiments, the user could define one or more mathematical equations that will derive the targets based upon some other input. For example, a mathematical equation could receive an average target, and could then provide a low target and a high target based on an extinction ratio.

The recommendation is then sent to laser device driver 100. Current limiter 103 will compare the recommendation against the bounded safety range of the bias current table, or the bounded safety range of the modulation current table, and if the recommendation does not violate the bounds of the safety ranges, laser device driver 100 will alter the output current in accordance with the recommendation.

Figure 2:
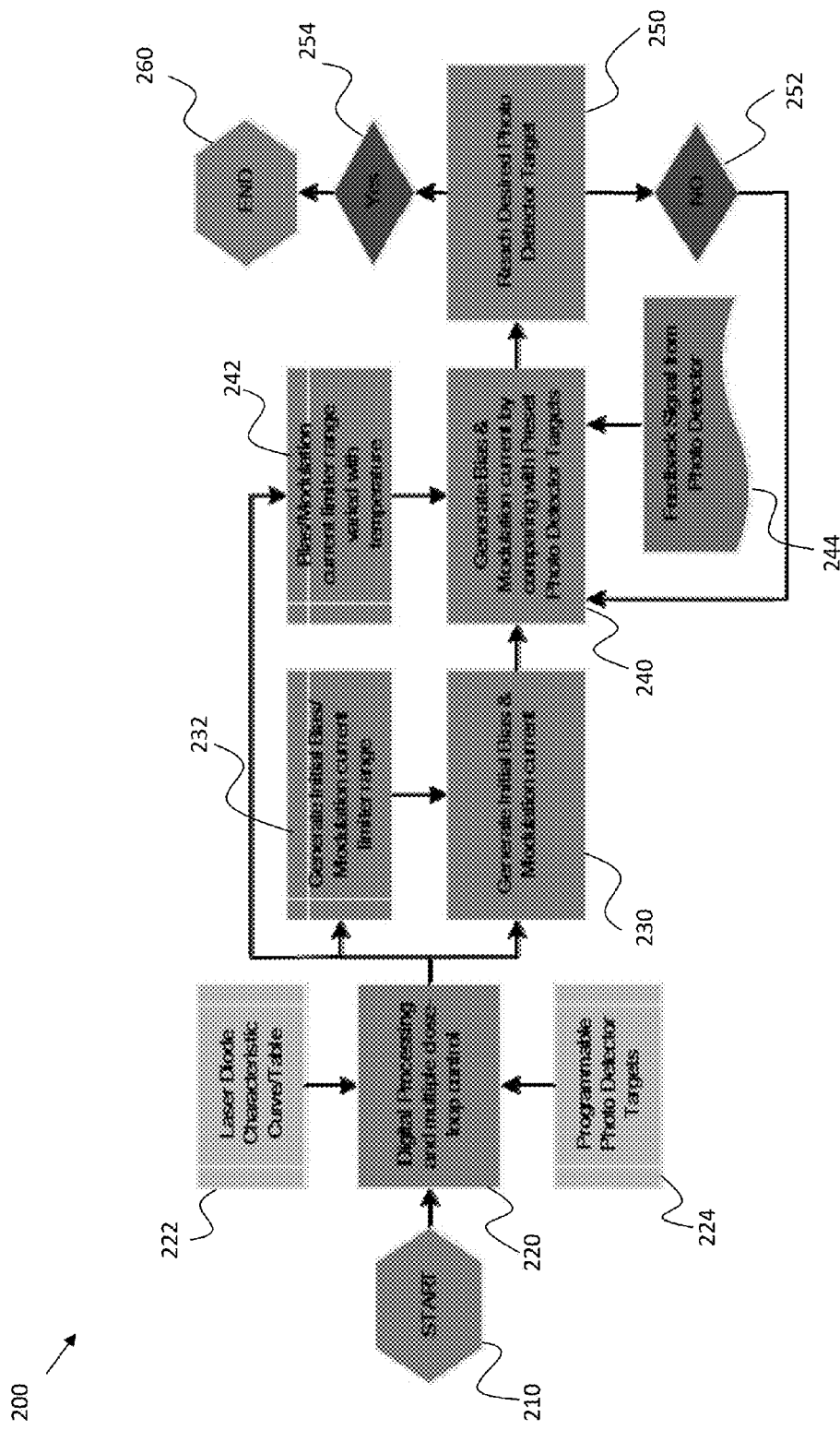
FIG. 2 shows a flowchart of logic used by the exemplary system of FIG. 1.

In FIG. 2, a method 200 is shown that illustrates a contemplated logic path followed by a laser device driver system.

In step 210, the system initializes, proceeding to step 220, where the digital circuitry initializes the laser diode driver settings in accordance with the pre-defined laser diode characteristic curve table 222. The programmable photo detector targets 224 are also loaded into the comparator in step 220, and the desired photo detector target is selected to ensure that the feedback loop is initialized properly.

In step 232, the system generates the bounded ranges for the bias of the output current to the laser diode and the modulation of the output current to the laser diode. In step 230, the laser diode driver outputs an initial current, which does not violate either of the bounded ranges as set by step 232.

If the feedback signal from 244 corresponds to a modulation and bias current setting that exceeds the bounded range set in step 242, then the modulation and bias currents will be set to either user defined values or to calculated target values as saved in memory.

In some embodiments, the recommendation could be modified by a limiter that varies with temperature, defined in table 242. Typically a user programs the range settings, which are automatically implemented at certain temperature points. In the design of the loop, those programmed settings are used to limit the output modulation and bias values of the laser ($P_1$ and $P_0$ level). For example, the recommendation could be to increase the output current by 30 milliAmps, but the laser diode might be at 70 degrees, which calls for an incremental current increase of 50 milliAmps. The recommendation could then be culled to only increase the output current by 40 milliAmps as doing more would violate the set boundary conditions.

At step 250, the system determines whether the output of the laser diode has met the desired target. If the system determines that the output has not met the desired target, the system will proceed to step 252 and compare the new output against the selected target in step 240 again. Typically this process with reiterate many times until a desired target is reached.

Once the desired target is reached, the system proceeds to step 254, and the process ends at 260, with the system maintaining the bias and modulation of the laser device driver output current unless the equilibrium is again disturbed.

In one embodiment of the present invention, high and low power level targets of an optical waveform are programmed through an optical power monitor feedback element (signal) respectively for closed-loop control and a preset of laser diode bias and modulation current curve (table) will be used to generate the limits of bias and modulation current adjustable range to ensure normal laser diode operation over temperature.

In the another embodiment of the present invention, average power level of an optical waveform is programmed through an optical power monitor feedback element (signal) for closed-loop control and high/low power level targets of optical waveform are automatically determined with preset equations. In parallel, a preset of laser diode bias and modulation current curve (table) will be used to generate the limits of bias and modulation current adjustment range to ensure normal laser diode operation over temperature This invention and improvement applies to any optical communication system that uses laser diodes. It can be implemented in an integrated circuit.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A laser diode driving system, comprising:
   a laser diode driver that generates an output current that drives a laser diode;
   a look-up table comprising
   a bounded safety range for a bias of the output current and a bounded safety range for a modulation of the output current;
   a feedback bias and modulation comparator that receives data on a laser diode output of the laser diode and that outputs a command setting to alter at least one of the bias and the modulation of the output current as a function of the received data to maintain a target and an extinction ratio between $P_1$ and $P_0$;
   a control mechanism that applies the command setting to the laser diode driver when the command does not exceed either the bounded safety range for the bias of the output current or the bounded safety range for the modulation of the output current.

2. The laser diode driving system of claim 1, wherein the target comprises a user-defined average target for the data on the laser diode output, wherein the feedback bias and modulation comparator outputs the command setting to alter the output as a function of both the received data and the user-defined average target.

3. The laser diode driving system of claim 1, further comprising a photo detector disposed to receive the laser diode output and generate the data, which is transmitted to the feedback bias and modulation comparator.

4. The laser diode driving system of claim 3, further comprising a trans-impedance amplifier that amplifies a signal received from the photo detector, wherein the photo detector transmits data to the feedback bias and modulation comparator via the trans-impedance amplifier.

5. The laser diode driving system of claim 1, further comprising a preload laser diode driver that defines the bounded safety range for the bias of the output current or the bounded safety range for the modulation of the output current.

6. The laser diode driving system of claim 1, wherein the look-up table further defines temperature-specific settings for driving the laser diode.

7. The laser diode driving system of claim 6, further comprising programmable range settings for each temperature-specific setting of the look-up table, wherein the control mechanism limits the application of the recommendation to the laser diode driver as a function of the programmable range settings.

8. The laser diode driving system of claim 1, wherein the target is user-selected from a high power target, a low power target, and a user-defined average target for the data on the laser diode output, wherein the feedback bias and modulation comparator generates the recommendation as a function of both the received data and a selected one of the average target, high power target, and low power target.

9. The laser diode driving system of claim 8, further comprising a preset user interface that sets the high power target, the low power target, and the average target.

10. The laser diode driving system of claim 8, further comprising a preset user interface that sets the average target, and a power level target optimizer that determines the high power target and the low power target as functions of the average target.

11. A method for driving a laser diode, comprising:
    defining a bounded safety range for a bias of an output current to the laser diode;
    defining a bounded safety range for a modulation of the output current to the laser diode;
    generating the output current to the laser diode;
    receiving data on an output laser from the laser diode;
    outputting a command setting to alter at least one of the bias and the modulation of the output current as a function of the received data to maintain an extinction ratio between $P_1$ and $P_0$;
    applying the recommendation to alter the output current when the command setting does not exceed either the bounded safety range for the bias of the output current or the bounded safety range for the modulation of the output current.

12. The method of claim 11, further comprising triggering a warning when the recommendation violates either the bounded safety range for the bias of the output current or the bounded safety range for the modulation of the output current.

13. The method of claim 11, further comprising:
    receiving the laser diode output via a photo detector; and
    generating the data on the output laser via the photo detector.

14. The method of claim 11, further comprising amplifying the generated data using a trans-impedance amplifier.

15. The method of claim 11, further comprising defining the bounded safety range for the bias of the output current and the bounded safety range for the modulation of the output current using a preload laser diode driver.

16. A laser diode driving system, comprising:
a laser diode driver that generates an output current that drives a laser diode;
a look-up table comprising a bounded safety range for a bias of the output current, a bounded safety range for a modulation of the output current, a user-defined average target, a high target, and a low target;
a user interface that receives a selection of one of the high target, the low target, and both the user-defined average target for the data on the laser diode output;
a feedback bias and modulation comparator that receives data on a laser diode output of the laser diode and that outputs a command setting to alter at least one of the bias and the modulation of the output current as a function of the received data and the selection to maintain a user-defined extinction ratio between $P_1$ and $P_0$; and
a control mechanism that applies the command setting to the laser diode driver when the command does not exceed either the bounded safety range for the bias of the output current or the bounded safety range for the modulation of the output current.

17. The laser diode driving system of claim 16, wherein the high target and low target are automatically generated as a function of the user-defined average target.

18. The laser diode driving system of claim 17, wherein the function is user-defined.

\* \* \* \* \*